United States Patent [19]

Setthachayanon

[11] Patent Number: 5,102,774
[45] Date of Patent: Apr. 7, 1992

[54] PHOTOIMAGABLE COATING COMPOSITIONS WHICH ARE DEVELOPABLE IN AQUEOUS ALKALINE SOLUTIONS AND CAN BE USED FOR SOLDER MASK COMPOSITIONS

[75] Inventor: Songvit Setthachayanon, Elizabethtown, Pa.

[73] Assignee: Armstrong World Industries, Inc., Lancaster, Pa.

[21] Appl. No.: 256,638

[22] Filed: Oct. 12, 1988

Related U.S. Application Data

[63] Continuation of Ser. No. 45,464, May 4, 1987, abandoned, which is a continuation-in-part of Ser. No. 939,604, Dec. 8, 1986, abandoned.

[51] Int. Cl.⁵ .................. G03F 7/027; G03F 7/038
[52] U.S. Cl. .................................. 430/284; 522/97
[58] Field of Search ........................ 522/97; 430/284

[56] References Cited

U.S. PATENT DOCUMENTS

| | | | |
|---|---|---|---|
| 3,775,377 | 11/1973 | Kokawa | 525/126 |
| 4,153,778 | 5/1979 | Park et al. | 528/76 |
| 4,430,486 | 2/1984 | Chang et al. | 525/453 X |
| 4,497,932 | 2/1985 | Trovati | 524/591 |
| 4,753,860 | 6/1988 | Hung et al. | 522/97 |

*Primary Examiner*—Cynthia Hamilton

[57] ABSTRACT

A UV sensitive coating composition is described which is a polymer prepared from a condensation reaction of a diisocyanate, a hydroxy alkyl (di or tri) (meth)acrylate and a carboxylic acid polyol. Optionally, a polyol and/or a dicarboxylic acid polyol can also be included as reactants. The coating polymer, thus prepared, can also be combined with binders and crosslinkers.

1 Claim, No Drawings

PHOTOIMAGABLE COATING COMPOSITIONS WHICH ARE DEVELOPABLE IN AQUEOUS ALKALINE SOLUTIONS AND CAN BE USED FOR SOLDER MASK COMPOSITIONS

CROSS-REFERENCE TO RELATED APPLICATION

This is a continuation of application Ser. No. 45,464, filed May 4, 1987 now abandoned which is a continuation-in-part of Ser. No. 939604, filed Dec. 8, '86now abandoned.

BACKGROUND OF THE INVENTION

1. Field of the Invention

This invention relates to a photosensitive resin composition. More particularly, it relates to a photosensitive resin composition for forming a protective coating film having excellent characteristics which can be used either alone, to provide a photosensitive, tacky coat; or it can be combined with a variety of other types of ingredients such as a crosslinker to increase crosslinking density, a resin to remove tackiness, or even another photosensitive ingredient to increase sensitivity to light. The uses of the instant photosensitive coating material thus includes photoresist applications such as plating resist, etch resist and solder mask.

Soldering masks are used to produce printed wiring boards. The solder masks function is basically to prevent soldering bridges, to keep electric insulation between conductors thus preventing conduction between solder areas and to prevent the corrosion of a naked copper conductor. It is also desirable to have photoimagable solder masks which are able to retain an image which can be used as a blueprint on which the solder is placed. Due to the desirability of increasing wiring density, it is desirable to use a solder mask having precise resolution and extremely good electrical insulation properties. The instant photosensitive composition can provide these advantages.

Known solder masks are described in U.S. Pat. No. 4,499,163 which describes a photosensitive resin composition containing urethane diacrylate or dimethacrylate, a linear polymeric compound having a glass transition temperature between about 40° and 150° C., and a sensitizer which generates free radicals in actinic light. The linear polymeric compound described includes the vinyl series linear polymers or copolymers such as, for example, polymers made from vinyl monomers including methyl methacrylate, butyl methacrylate, methyl styrene, vinyl toluene, and the like. The sensitizer for generating free radicals includes, for example, substituted and unsubstituted polynuclear quinones.

Another photocurable urethane acrylate resin composition which also is described as being usable for permanent resists, can be found described in U.S. Pat. No. 4,587,201. The composition therein described uses a urethane-acrylate resin which is composed of polybutadiene polymer. This resin is combined with a photopolymerization initiator to form the permanent resist material.

Most photoimagable solder masks, however, lack the ability of being developed in an aqueous solution. This necessitates the use of organic solvent developing solutions. The use of such organic solvents has become undesirable due to the environmental regulations for solvent emissions control.

Another disadvantage found with solder masks that use organic solvent developing solutions, is the continued sensitivity of the final product to organic solvents such as methylene chloride. In certain product applications, moreover, such susceptibility is undesirable.

It is therefore desirable to develop photoimagable solder masks coating compositions which can be developed in aqueous solutions, and which are resistent to organic solvents such as methylene chloride. It is an object of the instant invention to provide such a coating composition. It is also an object of the instant invention to provide a solder mask coating composition which can be stripped with commercial alkyline strippers. Accordingly, the photosensitive resin comositions described herein have excellent resolution, flexibility, adherance to metals, solvent resistance, high temperature resistance and electrical insulation properties.

Specific embodiments of the instant composition provides a highly viscous photosensitive material which is useful as an additive for compositions that require both thickening and the addition of a photosensitive coating material. In this way, the instant photosensitive materials fulfill a dual role, both as a thickener and as a photosensitive, photocurable additive. Such embodiments of the instant compositions are thus useful photosensitive, photocurable thickening agents for materials such as paints, inks, etc.

SUMMARY OF THE INVENTION

A photocurable coating composition includes a UV sensitive compound selected from: carboxylated urethane diacrylate, carboxylated urethane triacrylate, carboxylated urethane dimethacrylate and carboxylated urethane trimethacrylate. This group is hereinafter referred to as carboxylated urethane di (and/or) tri(meth) acrylate. It is also understood that (meth)-acrylate is intended herein to mean acrylate and/or methacrylate.

These carboxylated urethane di and/or tri(meth)acrylates are prepared from acidified moieties which provide the carboxyl group. These compositions are prepared by condensing a diisocyanate, a carboxylic acid polyol, and a hydroxy alkyl (meth)acrylate. The carboxylic acid polyol should be present in an amount needed to provide at least about 0.3, milliequivalents of acid per gram of the combined amount of the total amount of reactants; abbreviated herein as meq/g of TR (total reactants usually are the diisocyanate, carboxylic acid polyol, and hydroxy alkyl (meth)acrylate). In order to obtain a suitable level of photosensitivity in this product, the hydroxy alkyl (meth)acrylate should be used in a minimum amount of about 0.5 milliequivalents per gram of the combined amount of the diisocyanate, carboxylic acid di- or triol and hydroxy alkyl (meth)-acrylate.

The instant invention includes a variety of embodiments, achieved by combining the above coating composition with other specifically selected ingredients. Such ingredients, selected in order to provide or enhance a specific quality or characteristic, includes: a binder, a crosslinking agent, dyes, pigments, thermopolymerization inhibitors, and additives designed to improve coating properties.

DETAILED DESCRIPTION

The instant photocurable coating composition contains the carboxyl moiety, which alters the organophilic nature of the urethane (meth)acrylate polymer. As a result, the instant coating compositions become more organophobic, and thus are resistant to organic solvents such as methylene chloride. Further, these carboxylated photosensitive polymers can be mixed in large amounts with other hydrophilic binders and crosslinkers. In addition to this, the introduction of the carboxyl moiety makes the instant coating compositions soluble or swellable in aqueous alkali solutions (pH in excess of 7.5) until exposure to UV light. Advantageously, when the instant compositions are used to provide a photocurable coating, or solder mask, the development step can be done in aqueous alkali solutions. It can thus be noted that although the incorporation of the carboxyl moiety changes the nature of the urethane (meth)acrylate, making it soluble in aqueous alkali, the sensitivity of the compound to UV light is retained. The carboxylation, moreover, improves adherance to metals. Thus, an improved solder mask is provided by the combination of a binder, a crosslinker, and a carboxylated urethane di (and/or) tri(meth)acrylate. A preferred combination would use a copolymer of styrene/maleic anhydride as the binder (also providing carboxyl groups). Preferred crosslinkers are the (meth)acrylate, and polyfunctional (meth)acrylate monomers.

Preferred carboxylated urethane di (and/or) tri(meth)acrylates of the instant invention can be represented by to the formula under the following figure:

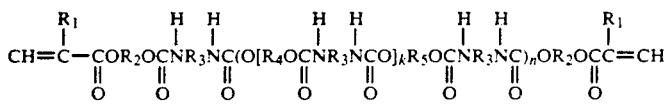

Figure 1 wherein n is an integer from 1 to 4; k can be either 0 or 1; and wherein $R_1$, derived from the acrylate reaction component (c) can be either a hydrogen or a methyl group; $R_2$, also derived from the alkyl (di or tri) (meth)acrylate reaction component (c), can be a linear or branched saturated hydrocarbon moiety having from 2 to 28 carbon atoms; $R_3$ is derived from the diisocyanate portion of the reaction mixture. $R_3$ can be branched, linear or cyclic, saturated, unsaturated or aromatic hydrocarbon moiety. $R_3$ can acceptably have from 4 to 20 carbon atoms, and preferably, has from 6 to 18 carbon atoms. For other preferred embodiments $R_3$ is derived from the diisocyanate reactant selected from trimethylhexamethylene, hexamethylene, isophorone, tolylene, 4,4,methybis(cyclohexyl) methylenediphenyl, and tetramethylxylene diisocyanates. $R_4$ is a linear, cyclic or branched, aromatic, saturated or unsaturated hydrocarbon acceptably having from 2 to 28 carbon atoms. $R_4$ can optionally also contain a hydroxyl moiety (remaining from the polyol used in the preparation of the composition). $R_5$ will be derived from a reaction mixture including (a) the carboxylic acid polyol shown in and described for FIG. 2; or (b) the carboxylic acid polyol of FIG. 2 and from the hydroxyl dicarboxylic acid shown in and described for FIG. 3. Thus, $R_5$ will always have at least one COOH moiety and will have a minimum of 3 carbon atoms. When $R_5$ is derived from (a) (from FIG. 2 compounds only) it will have only one COOH group with a branched or linear; saturated, unsaturated, or aromatic, acceptably, having a total of from 3 to 30 carbon atoms including the carboxyl carbon atom. When $R_5$ is derived from (b) the overall composition will have $R_5$ moieties derived from the carboxylic acid polyol of FIG. 2 and also $R_5$ moieties derived from the hydroxyl dicarboxylic acids of FIG. 3. The $R_5$ moieties derived from the FIG. 3 hydroxyl dicarboxylic acid compounds will, obviously, have two COOH groups and can also have from 3 to 30 carbon atoms, including the two carboxyl carbons. The descriptions given herein for the FIG. 2 and FIG. 3 compounds will provide more information regarding the concentrations and preferred structures of these $R_5$ moieties.

It should be realized that the exact location of each $R_5$ moiety within the polymer molecule will depend upon the number of reactive hydroxyl groups of the FIG. 2 or FIG. 3 compound, and upon the somewhat random condensation reaction. For example, when $R_5$ is derived from b) and when y of FIG. 3 is one, $R_5$ will be a terminal group having two COOH moieties; simultaneously other $R_5$ moieties from the same reaction mixture, (derived from the FIG. 2 carboxylic acid polyol) will be randomly located within the backbone of the polymeric molecular structure as indicated above in FIG. 1.

In FIG. 1, the $R_2$ preferably has from 2 to 16 carbon atoms, or, more preferably, is a moiety selected from the group consisting of: ethyl, propyl, butyl, and:

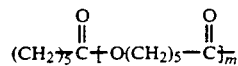

where m = 1 or 2.

$R_4$ is derived from the optional polyol which can be added to the reaction mixture. $R_4$ will, therefore, have from 2 to 28 carbon atoms and from 2 to 5 oxygen atoms. The oxygen atoms can possibly be in an unreacted hydroxyl moiety. When $R_4$ is present, acceptably, it has from 2 to 28 carbon atoms or, $R_4$ has, preferably, from 2 to 16 carbon atoms; still optionally having a hydroxyl moiety. Other preferred embodiments allow $R_4$ to be a saturated or unsaturated hydrocarbon moiety having from 2 to 10 carbon atoms and from 2 to 5 oxygen atoms possibly as an unreacted hydroxyl group. In specific examples of such preferred embodiments, $R_4$ is a moiety selected from: ethyl, propyl, butyl, pentyl, hexyl, heptyl, and octyl and having from 2 to 5 oxygen atoms from the previous hydroxyl moieties. $R_4$ can also be derived from glyceryl or 2-ethyl-2-(hydroxymethyl)-1,3propylene.

The carboxylated urethane di (and/or) tri(meth)acrylates of the instant invention can be obtained by condensing a diisocyanate with a carboxylic polyol (see FIG. 2) and a hydroxyalkyl(meth)acrylate in a one step reaction. The carboxyl-containing polyol can be any carboxylic acid containing 2 or more hydroxyl moieties. Suitably, there are from 2 to 5 hydroxyl groups. Preferably, either a carboxylic acid diol or triol.

Suitably, therefore, the carboxylic acid polyol can have the formula shown in FIG. 2 as follows:

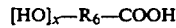      FIG. 2 wherein x is an integer from 2 to 5 and $R_6$ is a branched, cyclic or linear, saturated, unsaturated, or aromatic hydrocarbon moiety having from 2 to 29 carbon atoms. Preferably, $R_6$ has from 2 to 24 carbon atoms while x is 2 or 3 (such as in a diol or triol). Most preferably, x is 2 and $R_6$ is a branched or linear, saturated, unsaturated, or aromatic, hydrocarbon structure with from 2 to 20 carbon atoms. A preferred embodiment uses an alpha-alphadimethylol alkanoic acid as the carboxylated diol, most preferably, having an alkyl group having from 1 to 8 carbon atoms. Other preferred diol carboxylic acids are selected from: alpha-alphadimethylolacetic acid; alpha-alpha-dimethylolpropionic acid, alpha-alphadimethylolbutyric acid, alpha-alphadiethylolacetic acid; alpha-alpha diethylolpropionic acid; alpha-alphadipropy-lolpropionic acid; alphaalphadipropylolbutyric acid, and 2,3-dihydroxylpropanoic acid.

Optionally, a polyol can be additionally included in the reaction mixture. This will increase the molecular weight of the instant product. The presence of the polyol results in materials as depicted under FIG. 1 wherein k=1.

One embodiment of the instant invention can preferably be taken advantage of when a higher concentration of hydroxyl groups are provided, (such as by the addition of a polyol or by the use of a carboxylic acid as shown in FIG. 2 where x is 3, 4, or 5). In this embodiment, a hydroxyl dicarboxylic acid is added to the reaction mixture. FIG. 8 below shows a formula for some suitable hydroxyl carboxylic acids:

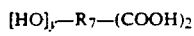
$[HO]_y-R_7-(COOH)_2$    FIG. 3 where y could be from 1 to 5, (preferably being from 1 to 3) and $R_7$ is a linear, cyclic, or branched; saturated, unsaturated, or aromatic hydrocarbon moiety acceptably having from 1 to 28 carbon atoms; preferably, having from 1 to 18 and most preferably, from 1 to 12 carbon atoms. If y is from 2 to 5, $R_7$ preferably ranges from 2 to 18 carbon atoms. Preferably, these diacids should be used when the hydroxyl concentration of the total reaction mixture is at least about 0.3 milliequivalents of OH per gram of the combined amount of the reactants, (the diisocyanate, the carboxylic acid polyol, the hydroxyl alkyl(meth)acrylate, the hydroxyl dicarboxylic acid and the polyol if present). These diacids can suitably be used in an amount of from about 0.3 to about 0.7 milliequivalents of acid per gram of the combined amount of the reactants. Some suitable hydroxy dicarboxylic acids can be selected from the group consisting of: malic acid, tartaric acid, dihydroxy tartaric acid, hydroxy adipic acid, dihydroxy adipic acid, and trihydroxy adipic acid.

These dicarboxylic acids can be used to provide thermally curable pendent or terminal ends. Advantageously, these ends can also provide reactive sites for future reaction with other materials. Melamine and epoxy for example are two compounds or moieties that can be reacted with the terminal carboxyl groups. By such reactions the characteristics of the material can be further modified or enhanced. The specific characteristics or qualities desired will depend on the intended use of the material.

To prepare the instant carboxylated urethane di (and-/or) tri(meth)acrylate coating composition, the reaction is carried out in a dry solvent solution which itself is non-reactive to the isocyanate. Suitable examples of such solvents are esters like ethylacetate and propyleneglycol monomethyl ether acetate; ketones like methyl ethyl-ketone, methyl isobutyl ketone, and N-methylpyrrolidone; aromatic hydrocarbons like toluene, xylene; and mixtures of the preceeding.

The reaction preparing the instant coating composition acceptably is conducted with the solids content of the solution in the range of from about 20 to about 100%, preferably in the range of from about 35 to 95% and, most preferably, from about 65 to about 85% by weight. The reaction temperature is generally from about 50° to about 95° C., and preferably from about 65° to 85° C. Preferably, homopolymerization is inhibited by the addition of a free radical polymerization inhibitor such as hydroquinone, m-dinitrobenzene, phenothiazine, and the like. Most preferably, they are used in an amount of from about 0.005% to about 1% by weight based on the weight of the solids.

It is also preferred to use a condensation catalyst such as tin or amine catalysts. Such catalysts can be selected from the group consisting of: di-butyl tin dilaurate, dimethyl tin dineodecanoate, dibutyltin bisoctylthioglycolate, triethylamine, and triethylendiamine. For best results, the reaction is carried out under a dry air blanket.

The diisocyanate can be a hydrocarbon that is branched, linear, or cyclic, saturated, unsaturated or aromatic. Acceptably, it has from 4 to 20 carbon atoms, preferably, it has from 6 to 18 carbon atoms. Diisocyanates can be selected from the group consisting of: xylylene diisocyanate; 1-isocyanato-3-isocyanatomethyl-3,5,5-trimethylcyclohexane; 3,3'-dimethyldiphenylmethane-4,4'-diisocyanate; 2,4,tolylenediisocyanate; 2,6-tolyenediisocyanate; 2,2,4-trimethylhexamethylene diisocyanate, 2,4,4-trimethylhexamethylene diisocyanate; methylene-bis(4-cyclohexylisocyanate); hexamethylenediisocyanate; meta-tetramethylxylenediisocyanate; paratetramethylxylenediisocyanate; methylene-bis-phenyldiisocyanate; 1,5-napthylene diisocyanate; metaphenyllene diisocyanate and mixtures of the above. The most preferred diisocyanates are: 2,6-tolylenediisocyanate; 2,4,tolylene-diisocyanate; 1-isocyanato-3-isocyanatomethyl-3,5,5 trimethylcyclohexane; 2,2,4-trimethylhexamethylene-diisocyanate, and 2,4,4,trimethylhexamethylene diisocyanate.

When a polyol is included, the molecular weight, cure speed, and crosslinking density will be increased. The polyol can have from 2-28 carbon atoms. Acceptably, the hydrocarbon portion can be branched or linear, saturated, unsaturated, or aromatic, and has from 2-5 hydroxyl moieties. Preferably, the polyol is a diol or triol having from 2 to 16 carbon atoms. Preferred diols can be selected from: ethyleneglycol, propyleneglycol, butanediol, pentanediol, hexanediol, octanediol, neopentylglycol, 2-methylpropane-1,3diol, cyclohexanedimethanol, and diethyleneglycol. Other preferred polyols include glycerol, trimethylolpropane, or hexanetriol which can also be used.

The hydroxyalkyl di or tri(meth)acrylate (Component C) can have an alkyl group with from about 2 to 28 carbon atoms. The alkyl moiety can also be linear cyclic, or branched, saturated or unsaturated. Preferably, the alkyl group of the hydroxylalkyl(meth)acrylate has from 2 to 12 carbon atoms. Some preferred hydroxyalkyl (meth)acrylates can be selected from: hydroxyethyl(meth)acrylate, hydroxylpropyl (meth)acrylate, hydroxbutyl (meth)acrylate, and compounds having the general formula:

$$CH_2=CH-\overset{O}{\underset{\|}{C}}-O[\overset{O}{\underset{\|}{C}}(CH_2)_5O]_m\overset{O}{\underset{\|}{C}}(CH_2)_5OH$$

where m is one or two.

When the instant coating composition is prepared, the concentrations of the reactants should be such that the total concentration of the hydroxyl groups is at least approximately equal to the amount of diisocyanate present. Broadly, this means that the concentration of the polyols, plus the diols of the dialkylol carboxylic acid, plus the hydroxyalkyl (meth)acrylate is sufficient to bring the ratio of the hydroxyl to the diisocyanate to at least about 0.95:1; and, preferably, to at least 1:1. Most preferably, the hydroxyl moiety has the excess of equivalents. Preferably, the hydroxyl should have an excess equivalents relative to the diisocyanate in the range of from about 1.05:1 to about 0.95:1; most preferably, it is in the range of from 1.02:1 to about 1:1.

The carboxylic acid polyol is an important ingredient of the instant coating composition, and is preferably present in an amount sufficient to allow the uncured copolymer to be soluble or swellable in aqueous alkali solutions. Suitably, the carboxylic acid polyol is present in a minimum amount of about 0.3 milliequivalents of acid/gram of the total amount of the reactants; preferably, in an amount equal to or greater than 0.5 milliequivalents of acid per gram of the total amount of reactants.

Polar solubility is even more enhanced when the carboxylic acid polyol is used in the reaction mixture in an amount greater than 0.8 acid milliequivalents per gram of the total amount of the reactants (meq/g of TR).

A preferred range of acid meq/g of TR is from about 0.8 to 1.6 acid meq/g of TR. If a highly viscous product, extremely suitable for combination with other materials is desired, it is most preferred that the reaction mixture contains a minimum amount of about 1 acid meq/g of TR; a most preferred range is from about 1 to about 1.6 acid meq/g of TR. The use of the diacid of FIG. 3 can also be used to add to the amount of acid milliequivalents.

Another advantage provided by the carboxylation of the urethane di and tri(meth)acrylates is that the UV sensitive compound can be combined with hydrophilic resins. Furthermore, by varying the concentration of the carboxylation in the urethane di and tri(meth)-acrylates, the hydrophilic nature of this UV sensitive compound can, to an extent, be controlled. This allows the hydrophilic character to be set for a specific resin. Thus, when one desires to use a more hydrophobic or less hydrophilic resin; a low concentration of carboxylation can be used in the urethane di and tri(meth)-acrylate, to increase compatibility with the selected resin. Conversely, if one desired to use a hydrophilic resin, the carboxyl concentration would be increased so that the resin and the urethane di and tri(meth)acrylate could be mixed in larger concentrations. Acceptably, the carboxylic acid polyol can be used in the reaction mixture in concentrations having the carboxylated polyol in an amount of from about 5 to about 45% by weight of the total amount of reactants (abbreviated as: by weight of TR), preferably, from about 5 to about 25% by weight of TR, most preferably, from about 12 to about 25% by weight of TR.

When a specific polyol is also included, it can be used in the reaction mixture in an amount of from about 2 to about 18% by weight of TR; and preferably, having from about 2 to about 15% by weight of TR.

For the diisocyanate, an acceptable concentration range is from about 30 to about 80% by weight of the TR. Preferably, it is in the range of from about 50 to 75% by weight of TR.

The hydroxyalkyl(meth)acrylate must be present in the reaction mixture in a minimum amount of about 0.50 meq of acrylate/g of TR to assure suitable UV sensitivity. A suitable range is from about 0.5 to about 1.6 meq of acrylate/g of TR. An acceptable weight percent range is in an amount of from about 5 to about 50% by weight of TR and, preferably, it is used in an amount of from about 10 to about 30% by weight of TR.

The instant carboxylated urethane di (and/or) tri(meth)acrylate copolymer coating composition can acceptably have a weight average molecular weight of from about 500 to about 6,500, preferably, from about 800 to about 3,000, and, most preferably, from about 1,000 to about 2,500 (determined by the Gel Permeation Chromatograph and based on a standard polystyrene calibration curve).

In one preferred embodiment, the instant coating composition is combined with a binder. The resin which is used for this preferably, should have a glass transition temperature (Tg) of about 155° C. or greater, and most preferably is hydrophilic. The high (Tg) will improve temperature resistance. Several commercially available resins can be used. Compatible mixtures can be achieved with the instant carboxylated urethane di (and/or) tri(meth)acrylates especially by advantageously varying the carboxyl concentration. Acceptable resins that can be used for this purpose are styrene/maleic anhydride copolymers, particularly those which have been partially esterified with low molecular weight alcohols. Copolymers of styrene/maleic anhydride are commercially available which have been esterified with mixtures of alcohols from methyl to butyl. Such copolymers are commercially available in a wide range of molecular weights. Acceptably, the molecular weight of this resin-binder should be in the range of from about 25,000 to about 300,000; and, most preferably, from about 60,000 to about 250,000. Preferably, the copolymer used has a ratio of styrene to maleic anhydride in the range of from about 1:1 to about 2:1. A preferred (Tg) range for the binder is from about 155° C. to about 200° C.

Acceptably, the binder can be used in an amount of from about 85 to about 25% by weight of the total composition, and, preferably, from about 17 to about 60% by weight of the total composition. Preferably, the carboxylated urethane di (and/or) tri(meth)acrylate coating composition is mixed with the binder so that the glass transition temperature (Tg) of the end product is from about 70° to about 190° C. Preferably, the binder acid number is from about 120 to about 280 mg of KOH/g of the binder. Other polymers having the above described molecular weight, Tg, and acid number can also be used as a binder with the instant carboxylated urethane di (and/or) tri(meth)-acrylate coating composition. Suitable polymers for use as binders include: methylmethacrylate-comethacrylic acid and methylmethacrylate-methylacrylate methyacrylic acid.

When the instant carboxylated urethane di (and/or) tri(meth)acrylate is used with other materials such as the above described binders, or other additives which can permissively be added such as crosslinkers, dyes, solvents, pigments, photoinitiators, thermal inhibitors, the concentration of the UV sensitive carboxylated coating ingredient should be in the range of from about 10 to about 85% by weight of the total combined composition. Preferably, it is in the range of from about 15 to about 75% and, most preferably, it is in the range of from about 17 to about 60% by weight of the total combined composition.

Preferred crosslinkers are the (meth)acrylate monomers. Crosslinkers are used when it is desirable to obtain a composition having a greater crosslinking density, which in turn improves resistance to solvents such as methylene chloride. More preferred, are polyfunctional (meth)acrylate monomers. Such polyfunctional monomers can be selected from: trimethylolpropanetri(meth-)acrylate, trimethylpropane ethoxylated tri(meth)-acrylate, dipentaerythritolhydroxypentaacrylate, and di-trimethylolpropanetetraacrylate.

Other crosslinkers which can be used can be selected from the group consisting of: divinyl ethers, acrylated epoxies, epoxy resins, and aminoplast resins. The acrylated epoxies are preferred since they improve overall heat resistance, solvent resistance, and overall adhesion.

When the instant carboxylated coating composition is used as a solder mask, the composition is coated on an appropriate substrate, and dried to a tack free condition. The coated substrate is then photoimaged with from about 75 to 105 mJ/sq. cm. of UV radiation, and then can be developed with an aqueous alkali solution. Preferably, the aqueous alkali solution is potassium or sodium carbonate. Generally, the photoimaged coated substrate is inspected at this point.

When the instant coating composition is used, it is advantageous in that, if desired, a coating can be easily stripped with an aqueous alkaline stripper, and redone. The amount of alkali needed in the stripping or developing solution is very low. A solution which is 1% by weight of the a base can be used. When the desired quality of an image is obtained, the instant coating can be given a post UV cure of 3–5 J/sq. cm. This is followed by a heat cure, preferably, at 150° C. for a sufficient curing time. The instant compositions have excellent resolution, flexibility, and adherance to metals.

The instant invention can also be readily understood from the examples that follow. It should be understood, however, that these examples are offered to illustrate the instant invention, and thus, they should not be used to limit it. All parts and percentages are by weight unless otherwise indicated.

EXAMPLE 1

The following example illustrates a preparation for the photoimagable coating composition.

The following ingredients were added to a 5 liter round-bottomed flask, fitted with a mechanical stirrer, a thermometer, a condenser, a gas inlet, and a heating mantle: 286.0 grams (g), (about 4 equivalents), of 1,6-hexanediol; 268.0 g. (about 4 equivalents) of dimethylolpropionic acid; 951.2 g. (about 8.2 equivalents) of 2-hydroxyethylacrylate; 0.23514 g. of phenothiazine as a free radical inhibitor; 783.8 g. of N-methyl-2-pyrrolidone as a solvent; and 31.35 g. of dibutyltindilaurate (T-12) as a catalyst. Under a dry-air blanket with agitation, 1,680.0 g. (about 16 equivalents) of trimethylhexamethylenediisocyanate was charged into the mixture in two equal portions which were 30 minutes apart. An exotherm took place for each addition. The reaction temperature was kept under 85° C. by cooling with an ice-water bath, and after the second addition of trimethylhexamethylenediisocyanate the reaction temperature was maintained at a constant 85° C. for 10–12 hours until the isocyanate infra-red absorption peak had disappeared, which indicated that the reaction had gone to completion.

EXAMPLE 2

The photosensitive coating composition which was prepared in Example 1 was used to prepare a photoimagable solder mask. The solder mask was prepared by charging the following ingredients to a 500 ml. round-bottom flask, equipped with a stirrer, a gas inlet, a thermometer, and a condenser: 6.5 g. of a low molecular weight copolymeric defoaming agent; 91.25 g. of N-methyl-2-pyrrolidone as a solvent; 82.0 g. of an esterified styrene/maleic anhydride copolymer was added as a binder. (The resin used here was Scripset 550 by Monsanto). The mixture was agitated and heated to 95° C. for 30 minutes to obtain a hazy solution. After this, the temperature was lowered to 70° C., and then the following ingredients were added to the mixture: 0.004 g. of the free radical polymerization inhibitor, phenothiazine; 77.5 g. of the UV sensitive coating composition prepared in Example 1, and 9.0 g. of a green pigment. While the mixture was blanketed with a flow of dry air, a premixed solution containing the following was added: 47.8 g. of trimethylolpropanetriacrylate (SR351) as a crosslinker, 6.5 g. of isopropylthioxanthone (abbreviated as ITX) as a photoinitiator and 8.4 g. of ethyl p-dimethylaminobenzoate (abbreviated as EPD) as a sensitizer.

The above ingredients were allowed to mix under a dry air blanket for 30 minutes at 70° C., after which time they were discharged into an amber jar. The solder mask thus prepared was used as described in Example 8.

EXAMPLE 3

The composition prepared in Example 2 was applied as a coating to two 6"×8" bare copper clad epoxy boards in a thickness of about two mils, using a 75 mesh monofilament polyester screen, and a rubber squeegee having 70 durometer hardness. This wet coating was dried to a 1.4 mil tack-free film in a forced-air oven at 100° C. in a period of 12 minutes.

After these dried films were cooled to room temperature, they were exposed at 75 mj/sq. cm. through an IPC (Institute for Interconnecting Packaging electronic circuits) No. B-25 negative artwork with 400 watt mercury vapor lamp. The exposed films were then developed manually in a 1% solution of $K_2CO_3$ for 45 seconds, and then rinsed with fresh water.

An excellent resolution of the IPC B-25 was produced.

After this development, the boards were cured at 3 J/sq. cm., and thermal baked at 150° C. for one hour as a post-cure process.

One of the boards was then soaked in methylene chloride (abbreviated $MeCl_2$) for 15 minutes, and no degradation was found on the mask (solvent resistance test).

The other board was given a cross-hatch adhesion test according to ASTM D3359-78 method B, and was found to have no adhesion loss. The board was then painted with a resin flux, and floated with the face having the solder mask down on a molten solder pot at 260°–275° C. for 10 seconds. After the solder pot test, the board was immediately rinsed with 1,1,1-trichloroethane while the board was still warm. One hour later, the board was given the same cross-hatch adhesion test and found to have no adhesion loss.

EXAMPLE 4

Using the apparatus and general procedure as described in Example 1, urethane diacrylate oligomers were prepared which varied in the amount of carboxylation. Sample 4 contained no carboxylation and Sample 9 contained the highest amount of carboxylation. All of the samples were prepared at 80% solids. The formulation used for each individual sample is shown in Table 1 below.

TABLE 1

The following abbreviations have been employed.
DMPA = dimethylolpropionic acid
2HEA = 2-hydroxyethyl acrylate
TMDI = trimethylhexamethylene diisocyanate
DTN = dimethyl tin dineodecanoate
M-Pyrol = N-methylpyrrolidone
eq. = equivalent

|  | eq. | Weight (gms) | eg. | Weight (gms) |
|---|---|---|---|---|
|  | Sample 4 | | Sample 5 | |
| 1,6 Hexanediol | 8 | 472 | 7.0 | 413.0 |
| DMPA | — | — | 1.0 | 67.0 |
| 2HEA | 8.1 | 939.6 | 8.2 | 951.2 |
| TMDI | 16 | 1680.0 | 16.0 | 1680.0 |
| DTN | — | 15.46 | — | 15.56 |
| M-Pyrol | — | 772.9 | — | 777.8 |
| Phenothiazine | — | 0.309 | — | 0.311 |
|  | Sample 6 | | Sample 7 | |
| 1,6 Hexanediol | 3.0 | 177.0 | 2.0 | 118.0 |
| DMPA | 5.0 | 335.0 | 6.0 | 402.0 |
| 2HEA | 8.2 | 951.2 | 8.2 | 951.2 |
| TMDI | 16.0 | 1680.0 | 16.0 | 1680.0 |
| DTN | — | 15.72 | — | 15.76 |
| M-Pyrol | — | 785.8 | — | 762.8 |
| Phenothiazine | — | 0.314 | — | 0.315 |
|  | Sample 8 | | Sample 9 | |
| 1,6 Hexanediol | 1.0 | 59.0 | 0 | 0 |
| DMPA | 7.0 | 469.0 | 8.0 | 536.0 |
| 2HEA | 8.2 | 951.2 | 8.2 | 951.8 |
| TMDI | 16.0 | 1680.0 | 16.0 | 1680.0 |
| DTN | — | 15.8 | — | 31.67 |
| M-Pyrol | — | 789.8 | — | 791.8 |
| Phenothiazine | — | 0.316 | — | 0.317 |

The viscosities of Samples 4-9 were measured (in CPS) at 75° F. using a Brookfield RVT Viscometer, #6 spindle at 10 RPM.

| Sample # | | | | | |
|---|---|---|---|---|---|
| 4 | 5 | 6 | 7 | 8 | 9 |
| Viscosity 20400 | 22400 | 41600 | 44800 | 68800 | 86400 |

EXAMPLE 5

Samples 5-9 of the carboxylated urethane acrylates were used to prepare solder masks. These solder masks were then tested for comparison of properties. This example, along with examples 6 and 7 which follow, can be used to compare the properties of the carboxylated urethane acrylates to masks containing the noncarboxylated urethane acrylates.

The solder masks designated herein as Example D-H were prepared using the apparatus and general procedure as described in Example 2.

The amount of each ingredient is given in the following table:

TABLE 2

| A Common Solder Mask Formula for Samples D-H | |
|---|---|
| Modaflow (a low molecular weight copolymer) | 6.5 |
| N-methyl pyrrolidone | 91.25 |
| Styrene/maleic anhydride (Scripset 550) | 82.0 |
| Phenothiazine | 0.004 |
| Carboxylated Urethane Acrylate | 77.5 |
| Green Pigment (9G5) | 9.0 |
| Isopropyl Thioxanthone | 6.5 |
| Ethylp-dimethylamino benzoate | 8.4 |
| Trimethylolpropayltriacrylate (SR351) | 47.8 |

Summary of Properties of Solder Masks Containing Carboxylation

| | Solder Mask (Sample No.) | | | | |
|---|---|---|---|---|---|
| | D | E | F | G | H |
| Carboxylated Urethane | 5 | 6 | 7 | 8 | 9 |

Using the solder masks of Samples D-H, bare, copper clad epoxy boards were coated using the general method as described in Example 3. The boards were then tested and evaluated.
Photospeed - was excellent at 75 mJ/cm² for Samples D-H.
Development: For Samples D-H in a 1% aqueous K₂CO₃ solution for samples was excellent.
In 1,1,1 trichloroethane development for Sample D-H was poor.
Adhesion Test Method: ASTM-D3359-78 Method B
(Scale 5 = No adhesion loss)
(Scale 0 = Complete adhesion loss)

| | Sample Number | | | | |
|---|---|---|---|---|---|
| | D | E | F | G | H |
| Adhesion before molten solder | 5 | 4-5 | 4-5 | 5 | 4-5 |
| Adhesion after molden solder was applied | 5 | 5 | 5 | 5 | 5 |

EXAMPLE 6

Samples of a solder mask composition, using the Sample 4 noncarboxylated material, was prepared as follows described in Example 2.

The ingredients and amounts of the ingredients are given in the following table:

TABLE 3

| Formulation | Solder Mask Sample A | Solder Mask Sample B |
|---|---|---|
| (Defoamer) | 1.10 | 1.30 |
| N-methylpyrrolidone | 41.8 | 50.35 |
| Scripset 550 | 30.68 | 36.50 |
| Phenothiazine | 0.0024 | 0.003 |
| Green Pigment (9G5) | 3.1 | 3.1 |
| Sample 4 | 29.0 | 75.0 |
| SR351 | 16.2 | — |
| Isopropyl Thioxanthone | 2.25 | 3.0 |
| EPD | 3.1 | 4.0 |

To provide a comparison using the procedures as described in Example 3 each of these formulations (A&B) were tested and used to coat a bare copper clad epoxy board which was further characterized. The results are given below:

| | Solder Mask Sample A Limited Compatibility | Solder Mask Sample B Total Phase Separation |
|---|---|---|
| Stability at 75° F. | 1 month | — |
| Development | | |
| 1% aq. K₂CO₃ | excellent | — |
| 1,1,1, trichloroethane | poor | — |
| Property | | |

Methylene Chloride Resistance was poor showing the solvent's effect after only a 2 min. exposure.

-continued

| | |
|---|---|
| Adhesion before molten solder* | 5 |
| Adhesion after molten solder* | 5 |

SR351 = Trimethylolpropane triacrylate
ITX = Isopropyl thioxanthone
EPD = Ethyl p-dimethylamino benzoate

*crosshatch adhesion - ASTM-D3359-78 Method B
Scale 5 = no adhesion loss
Scale 0 = complete adhesion loss

EXAMPLE 7

Also for the purpose of comparison, Sample 4 material was used to prepare a photosensitive element which was then evaluated for development in different types of solvents. The photosensitive element (Sample C) was prepared by mixing the ingredients in Table 3, at 50° C., in a 500-ml round-bottom flask equipped with a stirrer, a gas inlet, a thermometer, and a condenser.

The table below indicates the amount of each ingredient.

TABLE 3

A Solder Mask Composition (Sample C) Containing Non-Carboxylated Urethane Diacrylate (Sample 4)

| | (gms) |
|---|---|
| Formulation | |
| Sample 4 urethane diacrylate | 122.5 |
| Elvacite 2008 | 94.0 |
| PMA | 131.0 |
| Phenothiazine | 0.0044 |
| Irgacure 651 | 6.2 |
| Leuco Crystal Violet (dye) | 0.2 |
| Development | |
| in 1,1,1 trichloroethane | excellent |
| in 1% aqueous $K_2CO_3$ | no development |

Abbreviations Used Above.
Elvacite 2008 = polymethyl methacrylate (M.W. = 79,000)
PMA = propylene glycol monomethyl ether acetate
Irgacure 651 = 2,2-dimethoxy-2-phenylacetophenone The noncarboxylated urethane diacrylate (Sample 4) had a very limited compatibility with the styrene/maleic anhydride resin (scriptset 550). Homogeneous mixtures of the noncarboxylated urethane diacrylate and the styrene/maleic anhydride resin could be obtained only for a relatively short period of time (less than one month) but only when the ratio of the urethane diacrylate to the resin was less than one. When the ratio is increased, phase separation occurred (Sample B).

The carboxylated urethane di or tri (meth)-acrylate, however, can have varying concentrations of carboxylation, allowing them to be miscible and compattible in all proportions with the styrene/maleic anhydride resin and other binder resins. The results are excellent shelflife, uniformity, and high performance in properties of the products.

EXAMPLE 8

Carboxylated urethane triacrylate samples were prpared using the apparatus and general procedure as described in Example 1. The specific ingredients for each triacrylate sample is given in the table below.

TABLE 5

| | Sample 10 | | Sample 11 | |
|---|---|---|---|---|
| | (eq.) | (wt. in gms) | (eg.) | (wt. in gms) |
| 1,6 Hexanediol | 2.0 | 118.0 | — | — |
| Tone 0301 | — | — | 4.0 | 400.0 |
| Glycerol | 2.0 | 61.4 | — | — |
| DMPA | | | | |
| DMPA | 4.0 | 268.0 | 4.0 | 268.0 |
| 2HEA | 8.1 | 939.6 | — | — |
| Tone M-100 | — | — | 8.2 | 2820.8 |
| TMDI | 16.0 | 1680.0 | — | — |
| IPDI | — | — | 16.0 | 1777.6 |
| DTN | — | — | — | 52.66 |
| T-12 | — | 30.67 | — | — |
| M-Pyrol | — | 766.8 | — | 1316.6 |
| Phenothiazine | — | 0.23 | — | 0.395 |

Abbreviations used in the above table:
Tone 0301 = polycaprolactone triol with molecular weight of 300.
Tone M-100 = a reactive caprolactone acrylate
IPDI = isophorone diisocyanate
IPDI = 1-Isocyanato-3-isocyanato-methyl-3,5,5-trimethyl-cyclohexane The product of Samples 10 and 11 were then used to prepare the solder masks of Samples I and J, respectively.

The solder masks were prepared using the apparatus and general procedure as described in Example 2;

TABLE 6

Solder Mask Compositions Based On Carboxylated Urethane Triacrylates

| | Sample I | Sample J |
|---|---|---|
| Formulation | | |
| Modaflow | 1.10 | 1.10 |
| N-methyl | 41.8 | 41.8 |
| Scripset 550 | 30.68 | 30.68 |
| Phenothiazine | 0.0024 | 0.0024 |
| (Sample 10) | 29.0 | — |
| (Sample 11) | — | 29.0 |
| Green Pigment 9G5 | 3.1 | 3.1 |
| ITX | 2.25 | 2.25 |
| EPD | 3.10 | 3.10 |
| SR351 | 16.2 | 16.2 |
| Development properties: | | |
| in 1% by weight aqueous $K_2CO_3$ | Excellent | Excellent |
| $MeCl_2$ resistance | 6 min. (good) | 8 min. (good) |

(Tested by immersing in the solvent for stated period of time and evaluating the results as good if no effect is seen, poor if a solvent effect is seen.)
Crosshatch adhesion - ASTM-D3359-78 Method B
Scale 5 = no adhesion loss
Scale 0 = complete adhesion loss

| | | |
|---|---|---|
| Adhesion before molten solder | 5 | 4 |
| Adhesion after molten solder | 5 | 3 |

The boards used in the above tests were prepared using Samples I and J in accordance with the procedure described in Example 3.

What is claimed is:

1. A photoimagable, coating composition suitable for use in solder mask compositions, comprising: a UV sensitive polymer selected from the group consisting of: a carboxylated urethane dimethacrylate, a carboxylated urethane diacrylate, a carboxylated urethane triacrylate, a carboxylated urethane trimethacrylate; the said UV sensitive polymer being made by condensing a reaction mixture consisting of component (a) trimethylhexamethylene diisocyanate, component (b) dimethylolpropionic acid, and component (c) hydroxyethyl (meth)acrylate; provided that component (a) is present in an amount of from about 30 to about 80% by weight of the total amount of the reaction mixture; compartment (b) is present in an amount of from about 5 to about 45% by weight of the weight of the total amount of the reaction mixture with from about 0.8 to 1.6 milliequivalents of acid per gram of the total amount of the reaction mixture, and component (c) is present in an amount of from about 5 to about 50% by weight of the total amount of the reaction mixture with a minimum amount of 0.5 milliequivalents of acrylate per gram of the total amount of the reaction mixture, wherein the UV sensitive polymer containing the carboxyl moiety has a weight average molecular weight in the range of from about 1,000 to about 2,500 and is characterized by its hydrophilic nature, making a coating of the UV sensitive polymer more resistant to organic solvents like methylene chloride, after crosslinking; and further in that the introduction of the carboxyl moiety makes the instant coating compositions, before exposure to UV light, soluble or swellable in aqueous solutions having a pH in excess of 7.5 such that when the instant compositions are used to provide a photocurable coating, or solder mask, the development step can be done in aqueous solutions having a pH in excess of 7.5.

* * * * *

UNITED STATES PATENT AND TRADEMARK OFFICE
CERTIFICATE OF CORRECTION

PATENT NO. : 5,102,774
DATED : April 7, 1992
INVENTOR(S) : Songvit Setthachayanon It is certified that error appears in the above-identified patent and that said Letters Patent is hereby corrected as shown below:

column 10, line 33, "Example 8" should read --Example 3--.

Claim 1 at column 14, lines 62-63, "compartment (b)" should read --component (b)--.

Signed and Sealed this

Nineteenth Day of October, 1993

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,102,774
DATED : April 7, 1992
INVENTOR(S) : Songvit Setthachayanon It is certified that error appears in the above-indentified patent and that said Letters Patent is hereby corrected as shown below:

In column 3, line 36, the words "(di or tri)" should be deleted; in column 6, line 54, the words "di or tri" should be deleted; and in column 10, line 33, "Example 8" should read --Example 3--.

Claim 1 at column 14, lines 62-63, "compartment (b)" should read --component (b)--.

This certificate supersedes Certificate of Correction issued October 19, 1993.

Signed and Sealed this

Twelfth Day of April, 1994

Attest:

BRUCE LEHMAN

*Attesting Officer*   Commissioner of Patents and Trademarks